United States Patent [19]

O'Connell et al.

[11] Patent Number: 5,033,024
[45] Date of Patent: Jul. 16, 1991

[54] MATRIX MEMORY WITH REDUNDANCY AND MINIMIZES DELAY

[75] Inventors: Cormac M. O'Connell, Eindhoven; Leonardus Pfennings, deceased, late of Sittard; by Henricus J. Kunnen, executor, Valkenswaard; Peter H. Voss, Eindhoven; Thomas J. Davies, Eindhoven; Hans Ontrop, Eindhoven; Cathal G. Phelan, Eindhoven, all of Netherlands

[73] Assignee: U.S. Philips Corp., New York, N.Y.

[21] Appl. No.: 453,637

[22] Filed: Dec. 20, 1989

[30] Foreign Application Priority Data

Jan. 16, 1989 [NL] Netherlands .......................... 8900026

[51] Int. Cl.⁵ .............................................. G11C 13/00
[52] U.S. Cl. ................... 365/189.01; 365/200; 365/230.03
[58] Field of Search ...................... 365/189.01, 230.03, 365/200, 230.01

[56] References Cited

U.S. PATENT DOCUMENTS 4,599,709 7/1986 Clemons .............................. 365/200

Primary Examiner—Terrell W. Fears
Attorney, Agent, or Firm—Steven R. Biren

[57] ABSTRACT

An integrated matrix memory includes standard sub-blocks and a redundant block. Each of the standard sub-blocks has a fixed number of standard sub-blocks, and the redundant block has one or more redundant sub-blocks. For addressing there is provided a detector for the address of a faulty standard sub-block. In that case a redundant sub-block is selected. Selection is realized by way of a sub-bus which forms part of the data path. Thus, a redundant system is achieved in which delay is minimized.

7 Claims, 2 Drawing Sheets

MATRIX MEMORY WITH REDUNDANCY AND MINIMIZES DELAY

BACKGROUND OF THE INVENTION

The invention relates to an integrated matrix memory, comprising a series of p standard blocks, each of which comprises a uniform first number of i standard sub-blocks, each of which comprises a uniform second number of n storage columns, each sub-block in any block being connected, via a column selector, to a sub-bus which is exclusively assigned to each respective sub-block within the latter block, and which also serves for further sub-blocks of the same rank in other blocks, a bus selector being provided between respective sub-buses and an external data terminal.

When the matrix memory is addressed, normally a single standard block is activated, the other blocks not being activated. As a result, only part of the memory dissipates energy and the remainder does not dissipate energy. Within the activated standard block only one standard sub-block is addressed and, moreover, provided with a row address. In each column one bit position is then addressed. The column selector selects only a sub-set of the columns in the sub-block for connection to the associated sub-bus; thus, all sub-buses together address one memory location whose capacity depends on the proportioning of the memory. Finally, there is provided a bus selector for selecting only a single sub-bus, and hence a single bit location. The foregoing holds good for a read operation as well as for a write operation.

SUMMARY OF THE INVENTION

It is inter alia an object of the invention to provide a memory of the kind set forth above which can be repaired by way of redundancy in that there are provided redundant sub-blocks, offering a high degree of freedom as regards the mapping of a faulty sub-block on a substitute redundant sub-block, the selection between respective sub-blocks during a read operation taking place at the output side so that a comparatively large amount of time is available for the detection of an error address, the amount of redundancy being selectable by determination of the number of redundant sub-blocks. The latter number may in principle be arbitrary.

In accordance with a first aspect of the invention, there is also provided a redundant block which comprises a third number of j redundant sub-blocks, each of which comprises n storage columns, each of which is connected, to a respective sub-bus, via a further column selector, there being provided an error address detector for detecting an error address concerning a faulty standard sub-block and for activating in response thereto said redundant block, and also said redundant sub-block therein which is known in advance, by selective activation of the sub-bus connected to the relevant redundant sub-block. In accordance with the foregoing, the organization is such that during reading little or no delay occurs because of the parallel operation between normal addressing and that of a redundant sub-block. The procedure is also suitable for writing, because on the one hand a delay is usually built in for the data in view of the negative set-up time usually built in for that purpose, and on the other hand because the selection at the level of the standard sub-block/redundant sub-block can be made sufficiently quickly, and hence also the selection of said sub-bus.

In view of the latter it is advantageous to provide a block decoder which is subdivided into a predecoder and a main decoder, said error address detector being fed by output signals of the predecoder and also by primary sub-bus selection signals in order to activate, upon detection of said error address, secondary sub-bus selection signals as substitutes for primary sub-bus selection signals prevailing at that instant. The error address is then detected in parallel with the indication of the intended sub-block by decoding. If the latter sub-block were to contain an error, a redundant sub-block would be activated, but because of the parallellism the speed of operation is substantially independent of whether or not an error address is detected.

The invention also relates to an integrated circuit comprising a second series of matrix memories, each matrix memory comprising a separately adjustable error address detector. Flexibility is thus enhanced.

BRIEF DESCRIPTION OF THE DRAWING

The invention will be described in detail hereinafter with reference to the drawing, in which: Therein

DESCRIPTION OF A PREFERRED EMBODIMENT

Figure 1:
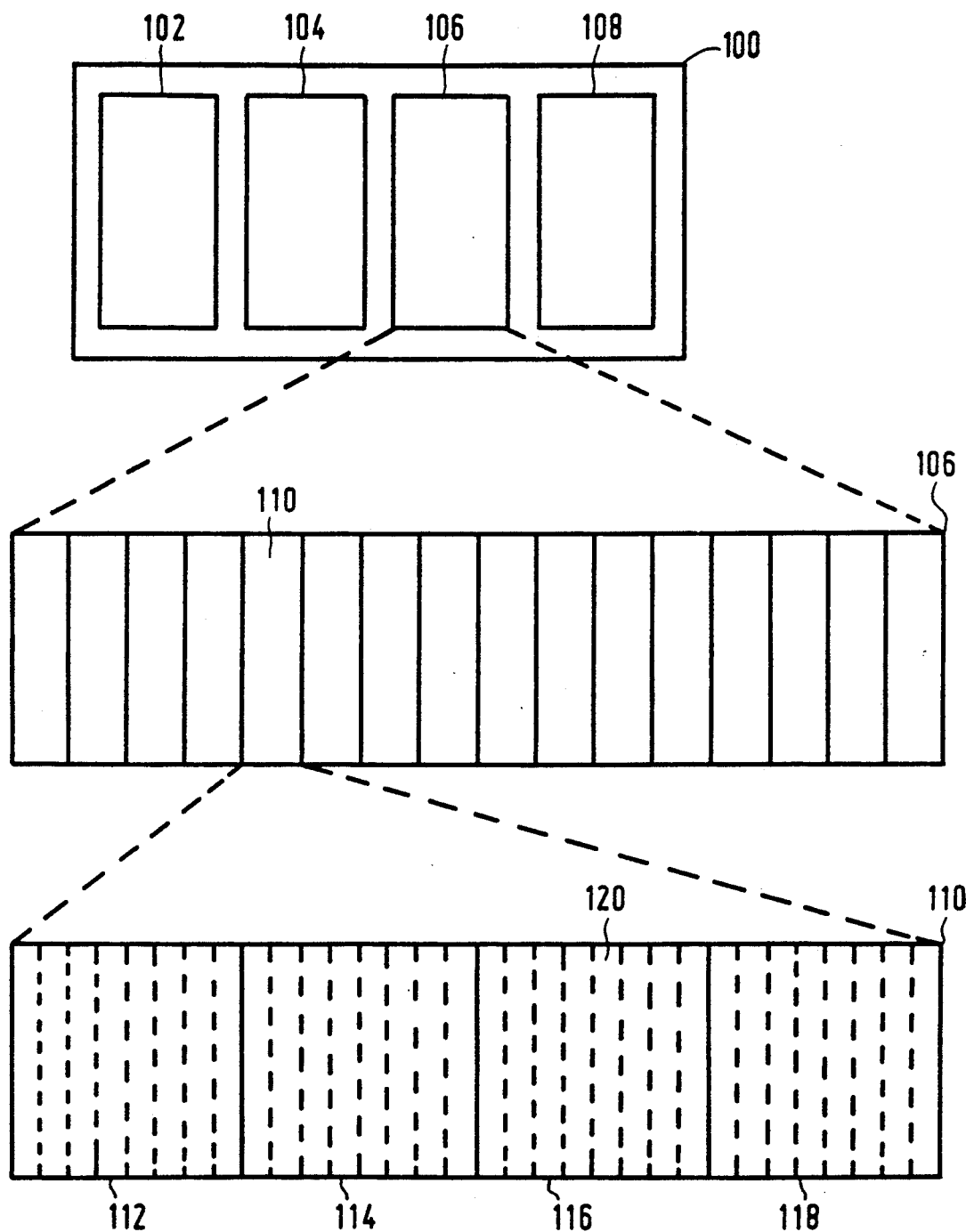
FIG. 1 shows a block diagram of a memory in which the invention can be used.

FIG. 1 shows a block diagram of a memory in which the invention can be used. The reference numeral 100 denotes the outline of a memory as realized in an integrated circuit. The memory 100 consists of four identical matrices 102 ... 108. The broken lines signify that the matrix 106 is shown in detail (at an enlarged scale). From this enlargement it appears that the matrix 106 consists of 16 blocks, only the block 110 of which is numbered. Further broken lines signify that the block 110 is shown in detail again at an enlarged scale. From this enlargement it appears that the block 110 consists of four sub-blocks, each of which consists of 8 columns of bit cells. Each column contains 128 bit cells. The total capacity of this memory thus amounts to $4 \times 16 \times 32 \times 128 = 256$ kbits. The invention, however, is not restricted to such a capacity. FIG. 1 does not show the facilities for accessing the memory, the redundant storage capacity and the associated selection mechanism.

Figure 2:
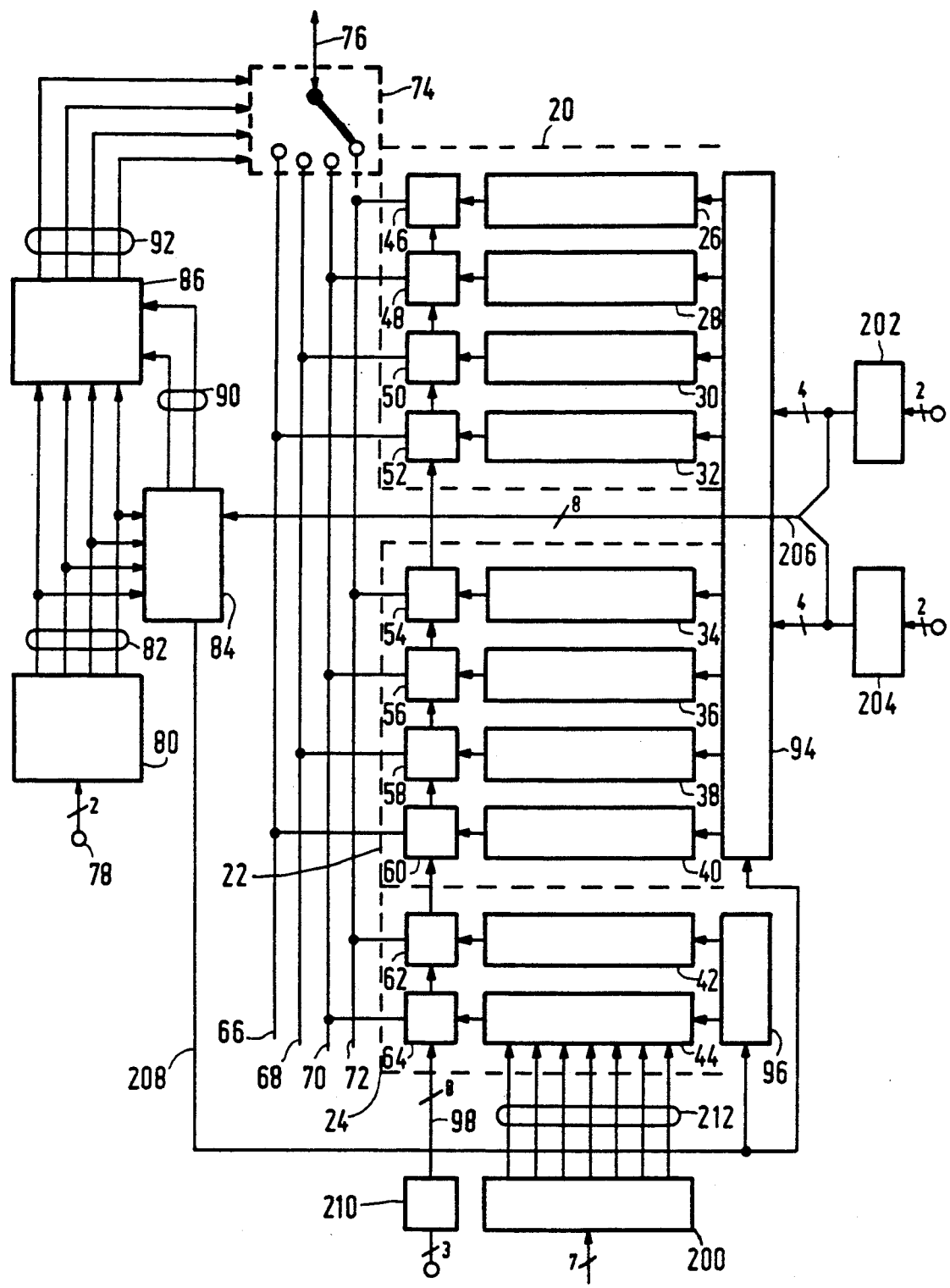
FIG. 2 shows a more detailed block diagram of said memory.

FIG. 2 is a more detailed block diagram of a part of the matrix memory of FIG. 1, selection and redundancy also being shown. Only one of the matrices described above is indicated, for example only a part of the matrix 106. The intended storage capacity is achieved by way of a series of p standard blocks 20, 22. In the present example, p=16, but only 2 blocks are shown. The storage capacity per standard block is achieved by way of a first number of i standard sub-blocks per standard block 26, 28 ... 40. In this case i=4, but the number may also be smaller (for example 2) or larger (for example, 8). The storage capacity per standard sub-block is realized by way of a second number of n storage columns which extend from left to right in the Figure. In this case n=8 (so 32 columns per standard block), but a larger or smaller number is also possible. There is also provided a single redundant block 24 which comprises j redundant sub-block. In this case j=2, but another number is also possible. For i=4, j may have all values 1, 2, 3, 4. For i=2, j may have the values 1, 2 and so on for other values of i. The standard sub-blocks are composed in the same way as the redundant sub-blocks, i.e. they comprise the same numbers of rows and columns.

Each of the standard sub-blocks and redundant sub-blocks also comprises a column selector 46 ... 64. Each column selector is connected to a sub-bus 66 ... 72. Within each standard block and within the redundant block all column selectors are connected to a unique sub-bus. The number of column selectors per sub-bus amounts to 2 or 3 in the present example; thus, the column selectors 52, 60 are assigned to the sub-bus 66, and the column selectors 46, 54, 62 are assigned to the sub-bus 72. Alternatively, for each sub-bus the same number of columns selectors may be provided. All sub-buses can be connected to external data terminal 76 via a bus selector 74.

The matrix memory also comprises the following parts: an address input 78, a predecoder 80, an error address detector 84, a correction element 86, two predecoders 202, 204, a standard block address decoder 94, an activator 96 for the redundant block 24, and a further predecoder 210.

The following sub-operations take place when the matrix is accessed. In the preferred embodiment the two most-significant address bits are used for selecting one of the four matrices. For the part of the memory which is shown in FIG. 2, the decoding result acts as the enable result; this is not elaborated. 16 address bits then remain. 7 of these 16 bits are necessary for selecting the row. These bits are applied in parallel to the row selection decoder 200 which selects one of the 128 rows. The path width of the bundle 212 (=128), therefore is only shown symbolically. In the set-up shown in FIG. 1, four of the nine remaining address bits are necessary for selecting the relevant block. To this end, they are applied to the predecoders 202, 204 in groups of two, each predecoder converting the binary code into a one-out-of-four code. The two one-out-of-four codes are applied to the standard block main decoder 94. For example, for each of the 16 standard blocks this main decoder comprises an AND gate which receives a unique combination of the bits formed by the predecoders 202, 204, so that at the most one standard block is activated. The two one-out-of-four codes are also applied to the error address detector 84 via a line 206. Furthermore, three address bits are required for selecting the column to be addressed in an addressed sub-block. These three address bits can be applied to the column selectors 46 ... 64 which in that case always receive the same input signals. Another (preferred) possibility is that these 3 bits are applied to a further predecoder 210 which forms a 1-out-of-8 code: the line 98 has a width of 8 bits and the column selectors act only as switches. Even though the set-up shown in FIG. 2 would allow for a smaller number, in the foregoing use has been made of the numbers of bits which relate to the embodiment shown in FIG. 1.

Assume that in the described case a bit must be selected from the standard block 20. Via the decoders last described and via control by mode signal (R/$\overline{WR}$) and clock/enable signals (CL, CE), one respective column is addressed via each of the column selectors 46 ... 52. In a preferred embodiment the absence of the chip select signal acts as a disenable signal for the address buffers at the inputs of the respective address (pre)decoders. Furthermore, two bits are applied to input 78 for the selection of the standard sub-block in the block to be selected. These two bits are translated into a one-out-of-four code which is applied to the elements 86 and 84.

The error address detector 84 receives the out-out-of-four code from the decoder 80 and the two one-out-of-four codes from the predecoders 202, 204. The error address detector 84 detects whether a given code received corresponds to a correct sub-block or to a faulty sub-block. A relevant circuit is described in European patent application Ser. No. 87202286.8, and corresponding U.S. patent application Ser. No. 265640, the latter incorporated herein by way of reference. Such a detector can be set, for example by means of fuse elements, for programming the detector in series with an activation element which indicates whether the detector may anyhow be activated. When the address received ($3 \times 1$-out-of-4) indicates a correct sub-block, on line 208 a signal appears which activates the decoder 94 and which deactivates the activator 96. On the line 90 a two-bit signal appears which renders the element 86 conductive for the one-out-of-four code formed by the decoder 80. The latter code sets the switch 74 to the position corresponding to the sub-bus 66, 68, 707, 72 to be activated, which bus thus communicates with the external terminal 76. In the described case the detector 84 comprises two separate, separately programmable elements: one each for the two redundant sub-blocks 42, 44. In the case of a different number of redundant sub-blocks, the number of detector elements is higher/lower accordingly.

When a faulty sub-block is accessed, one of the two detector elements in the error detector 84 outputs a positive signal. The positive signals are combined on the line 208, for example in an OR function (not separately shown). For the activator 96 this signal acts as an activation signal; for the decoder 94 it acts as a deactivation signal. The element 96 does not perform a selection between redundant sub-blocks 42, 44 but acts only for activating these sub-blocks, be it together or not. Contrary to the previous situation, an activation signal then appears on the lines 90. This is, for example one bit which represents the activation and one bit which performs a selection between the sub-bus 70 (redundant sub-block 44) and the sub-bus 72 (redundant sub-block 42). According to another possibility, each of the two lines of the connection 90 activates one of the redundant sub-blocks. In the latter case both wires of the connection 90 are combined in an OR-function, the output of this OR gate disenabling all connections of the line 82. The respective lines of the connection 90 are again combined, in an OR-function, together with the control connection for the associated sub-bus.

Advantages of the invention are apparent directly from the Figure. During a read operation the check as regards addressing of a "faulty" standard sub-block is executed in parallel with the selection of the sub-block itself. The locations within this standard sub-block and the locations within a redundant sub-block to be possible addressed are also determined in parallel. As if it were at the "very last instant" the correction is then performed by way of signals on the lines 90 and 208 upon detection of a faulty standard sub-block. Thus, hardly any delay occurs when a redundant sub-block is to be addressed instead of a standard sub-block during a read operation.

In view of the negative set-up time, for example upon a changeover from a read mode to a write mode, in the case of a write operation the data are usually already slightly delayed because of a unidirectional delay (not shown) which does not occur during reading. In that case it is not objectionable that the switch 74 could be switched over at the beginning of the data path to the sub-block to be addressed.

Because the substitute redundancy is activatable on the basis of sub-block, a high degree of flexibility is achieved: if necessary, a plurality of sub-blocks which can be selected at random with respect to one another can be replaced. The memory described with reference to FIG. 2 may form part of a parallel connection in order to realize a wider data path. Another possibility in this respect is that, for example for each sub-block two columns can be selected; for example, 8 sub-buses are then arranged in parallel and two switches 74 are provided.

We claim:

1. An integrated matrix memory, comprising a series of p standard blocks, each of which comprises a uniform first number of i standard sub-blocks, each of which comprises a uniform second number of n storage columns, each sub-block in any block being connected, via a column selector, to a sub-bus which is exclusively assigned to each respective sub-block within the latter block and which also serves for further sub-blocks of the same rank in other blocks, a bus selector provided between respective sub-buses and an external data terminal, a redundant block which comprises a third number of j redundant sub-blocks, each of which comprises n storage columns, each of which is connected to a respective sub-bus via a further column selector, and error address detector means for detecting an error address concerning a faulty standard sub-block and for activating in response thereto said redundant block, and also said redundant sub-block therein which is known in advance by selective activation of the sub-bus connected to the relevant redundant sub-block.

2. A matrix memory as claimed in claim 1, further comprising a block decoder which is subdivided into a predecoder and a main decoder, said error address detector means being fed by output signals of the predecoder and also by primary sub-bus selection signals in order to activate, upon detection of said error address, secondary sub-bus selection signals as substitutes for primary sub-bus selection signals prevailing at that instant.

3. A matrix memory as claimed in claim 2, characterized in that said primary sub-bus section signals are supplied by a sub-bus selection decoder.

4. A matrix memory as claimed in claim 1 or 2, characterized in that the number of redundant sub-blocks is smaller than the number of standard sub-blocks per standard block.

5. A matrix memory as claimed in claim 1, 2 or 3, characterized in that the number of redundant sub-blocks is equal to the number of standard sub-blocks per standard block.

6. A matrix memory as claimed in claim 1, 2 or 3, characterized in that the column selector selects a single column from the associated standard/redundant sub-block.

7. An integrated circuit, comprising a second series of matrix memories as claimed in claim 1, 2 or 3, each matrix memory comprising a separately-adjustable error address detector means.

* * * * *